United States Patent
Pang

(10) Patent No.: US 7,093,226 B2
(45) Date of Patent: Aug. 15, 2006

(54) METHOD AND APPARATUS OF WAFER PRINT SIMULATION USING HYBRID MODEL WITH MASK OPTICAL IMAGES

(75) Inventor: Linyong Pang, Castro Valley, CA (US)

(73) Assignee: Synopsys, Inc., Mountain View, CA (US)

( * ) Notice: Subject to any disclaimer, the term of this patent is extended or adjusted under 35 U.S.C. 154(b) by 194 days.

(21) Appl. No.: 10/785,254

(22) Filed: Feb. 23, 2004

(65) Prior Publication Data

US 2004/0172611 A1 Sep. 2, 2004

Related U.S. Application Data

(60) Provisional application No. 60/451,235, filed on Feb. 28, 2003.

(51) Int. Cl.
*G06F 17/50* (2006.01)
(52) U.S. Cl. .......................................... 716/19; 716/21
(58) Field of Classification Search ................. 716/19, 716/21
See application file for complete search history.

(56) References Cited

U.S. PATENT DOCUMENTS

| 5,965,306 | A | * | 10/1999 | Mansfield et al. ............ 430/22 |
| 6,289,499 | B1 | | 9/2001 | Rieger et al. |
| 6,577,994 | B1 | * | 6/2003 | Tsukuda ...................... 703/15 |
| 2002/0164065 | A1 | | 11/2002 | Cai et al. |
| 2002/0194576 | A1 | | 12/2002 | Toyama |

FOREIGN PATENT DOCUMENTS

WO  WO 01/65317 A2  9/2001

OTHER PUBLICATIONS

Bruner et al. "Simple Models for Resist Processing Effects", Jun. 1996, Penn Well Publishing, Solid State Technology, vol. 39, iss. 6, pp. 95-99.*
Peng et al., "Direct Interferometric Phase Measurement Using Aerial Image Measurrement System", Mar. 1999, SPIE Conference on Metrology, Inspection, and Process Control for Microlithography XIII, SPIE vol. 3677, pp. 734-739.*
Lu et al. "Application of Simulation Based Defect Printability Analysis for Mask Qualification Control," Proceeedings of the SPIE, vol. 5038, Feb. 2003, p. 33-40.
Pang et al. "Simulation-based Defect Printability Analysis on Alternating Phase Shifting Masks for 193 nm Lithography," Proceedings of the SPIE, vol. 4889, Oct. 2002, p. 947-954.
Randall et al. "Variable Threshold Resist Models for Lithography Simulation," Proceedings of the SPIE, vol. 3679, Mar. 1999, pp. 176-182.

* cited by examiner

*Primary Examiner*—Sun James Lin
(74) *Attorney, Agent, or Firm*—Bever, Hoffman & Harms, LLP; Jeanette S. Harms

(57) ABSTRACT

To exam mask defect impact during the transfer of a mask pattern to a wafer layer, tools can use mask images obtained during mask inspection. Specifically, these tools can also use optical models of such mask images to simulate wafer images. However, when feature sizes become very small, optical models may not provide sufficiently accurate simulation results. Using a photoresist model would yield significantly more accurate simulation results than using an optical model. Unfortunately, resist modeling is very slow, thereby making it commercially impractical. A simulation tool can generate a simulated wafer image having the accuracy of a photoresist model with the speed of an optical model by using a threshold look-up table. In one embodiment, the threshold look-up table could include variables such as feature size, pitch size, feature type, and defect type.

14 Claims, 3 Drawing Sheets

METHOD AND APPARATUS OF WAFER PRINT SIMULATION USING HYBRID MODEL WITH MASK OPTICAL IMAGES

RELATED APPLICATIONS

This application claims priority of U.S. Provisional Patent Application No. 60/451,235, entitled "Method And Apparatus of Wafer Print Simulation Using Hybrid Model With Mask Optical Images" filed Feb. 28, 2003.

BACKGROUND OF THE INVENTION

1. Field of the Invention

The present invention relates to simulating wafer printing and in particular to supplementing wafer print simulation using optical models with a threshold look-up table (LUT).

2. Description of the Related Art

To fabricate an integrated circuit (IC), a physical representation of the features of the IC, e.g. a layout, is transferred onto a plurality of masks. Note that as used herein, the term "mask" includes "reticles". The features make up the individual components of the circuit, such as gate electrodes, field oxidation regions, diffusion regions, metal interconnections, and so on. A mask is generally created for each layer of the IC. To create a mask, the data representing the layout for a corresponding IC layer can be input into a device, such as an electron beam machine, which writes IC features onto the mask. Once a mask has been created, the pattern on the mask can be transferred onto the wafer surface using a lithographic process.

Lithography is a process whose input is a mask and whose output includes the printed patterns on a wafer. To facilitate this pattern transfer, a material called photoresist is applied as a thin film to the surface of a wafer layer. The photoresist is exposed to light or some other form of radiation through the mask. This development can remove either exposed portions of the photoresist (for a positive photoresist) or unexposed portions of the photoresist (for negative photoresist). Therefore, subsequent processing of the wafer, which includes etching of the exposed portions of the wafer layer, should replicate the mask pattern in that wafer layer.

To optimize this replication, compute programs can be used to simulate the two-dimensional aerial image that is formed from exposing the mask. Such tools can simulate wafer printing using mask images obtained during mask inspection. These tools typically use optical models to simulate the two-dimensional aerial images (i.e. the wafer images). Based on the predicted aerial image, the mask pattern can be altered, if necessary, to better replicate the mask pattern on the wafer layer.

However, when feature sizes shrink below 90 nm, optical models may not provide sufficiently accurate simulation results. Specifically, the role of photoresist (also called resist) can significantly increase below this dimension, thereby changing the simulation results provided by optical models. Moreover, the next generation resist, i.e. resist for the 193 nm technology node and below, may fail to provide high contrast definition. Current optical models assume that resist at the 248 nm technology node can provide high contrast definition. Therefore, simulations generated using these optical models for the next generation of resist could be inaccurate.

Using a resist model for feature sizes below 90 nm would yield significantly more accurate simulation results than using an optical model. Unfortunately, resist modeling is computationally intensive. Specifically, a user must provide various resist parameters (e.g. photoresist thickness, etch rate, etc.) in addition to stepper parameters (e.g. numerical aperture (NA), wavelength ($\lambda$), partial coherence ($\sigma$), and illumination type). Therefore, resist modeling is very time consuming, e.g. on the order of 10× slower than optical modeling, thereby making it impractical in a production environment.

To increase the accuracy of the simulation results using an optical model, a threshold could be determined. The threshold refers to the level of light intensity at which the photoresist is activated, thereby printing a feature on the wafer. Unfortunately, a mask house, which is responsible for manufacturing the mask, would typically not have this threshold information.

The threshold of a specific feature (or defect) can be inferred from a neighboring feature. For example, a reference (i.e. a known) feature in the mask image could be simulated to determine its critical dimension (CD). That CD can then be used to determine the threshold on an associated aerial image. This threshold can then be used in simulating the feature of interest in the same mask image. However, a mask typically does not include such reference features. Therefore, an optical model with a fixed (e.g. a standard) threshold is generally used, thereby resulting in sub-optimal simulation results.

Therefore, a need arises for a commercially viable process that can provide accurate simulation results when feature sizes shrink below 90 nm.

SUMMARY OF THE INVENTION

To exam mask defect impact during the transfer of a mask pattern to a wafer layer, tools can use mask images obtained during mask inspection. Specifically, these tools can also use optical models of such mask images to simulate wafer images. However, when feature sizes become very small, optical models may not provide sufficiently accurate simulation results.

Using a photoresist model (also called a resist model) at very small feature sizes would yield significantly more accurate simulation results than using an optical model. Unfortunately, resist modeling is computationally intensive. Therefore, resist modeling is very time consuming, thereby making it impractical in a production environment.

In accordance with one aspect of the invention, a simulation tool can generate a simulated wafer image having the accuracy of a resist model with the speed of an optical model by using a threshold look-up table (LUT). This threshold LUT can be created by performing a one-time simulation of a test layout using a resist model. The test layout can include various patterns, pitch sizes, and feature sizes.

This one-time simulation using a resist model yields accurate wafer edge locations of features, on the, test layout. The test layout can also be simulated using an optical model which provides aerial image information of features on the test layout.

At this point, the wafer edge locations can be matched to the aerial image information. Based on this matching, thresholds for a plurality of features can be computed. These thresholds can be advantageously stored in a threshold LUT.

Because thresholds can vary for different patterns, pitch sizes, and feature sizes, the LUT can be organized based on threshold and at least one of pattern, pitch size, and feature size. In one embodiment, the LUT can include the thresholds for more than one resist.

Once the threshold LUT is created, an accurate and quick wafer simulation can be performed on an actual mask image using an optical model. A feature from the mask image can be characterized using variables from the LUT such as pattern, pitch size, and feature size. With this characterization, the appropriate threshold data in the LUT can be accessed. Because the LUT has been generated using a resist model, applying the threshold data to the wafer simulation advantageously generates accurate wafer contours of the feature. This hybrid wafer simulation, i.e. using an optical model and a LUT created using a resist model, can be done automatically using a computer-implemented program including code for performing the above-described steps.

In one embodiment, the threshold data can indicate an exact match for the characterized feature or, alternatively, at least the closest match in the LUT. In another embodiment, a more accurate model that includes both resist and etch model can also be used in creating the LUT, thereby further improving the accuracy of the wafer simulation results.

DETAILED DESCRIPTION OF THE FIGURES

To exam mask defect impact during the transfer of a mask pattern to a wafer layer, tools can use mask images obtained during mask inspection. Specifically, these tools can also use optical models of such mask images to simulate wafer images. However, when feature sizes shrink below 90 nm, optical models may not provide sufficiently accurate simulation results.

Of importance, the role of photoresist can significantly increase below this dimension, thereby changing the simulation results provided by optical models. Moreover, the next generation photoresist may fail to provide high contrast definition below this dimension. Therefore, simulations generated using these optical models for the next generation of resist could be inaccurate. Unfortunately, resist modeling is computationally intensive and time consuming, thereby making it impractical in a production environment.

Therefore, a simulation tool is desired that can generate a simulated wafer image-having the accuracy of a photoresist model with the speed of an optical model. In accordance with one aspect of the invention, a threshold look-up table (LUT) can be used with an optical model to provide quick, accurate wafer simulation. In one embodiment, the threshold LUT can include one or more variables such as feature size, pitch size, feature type, and defect type. The threshold LUT can be created using a calibration process.

Figure 1:
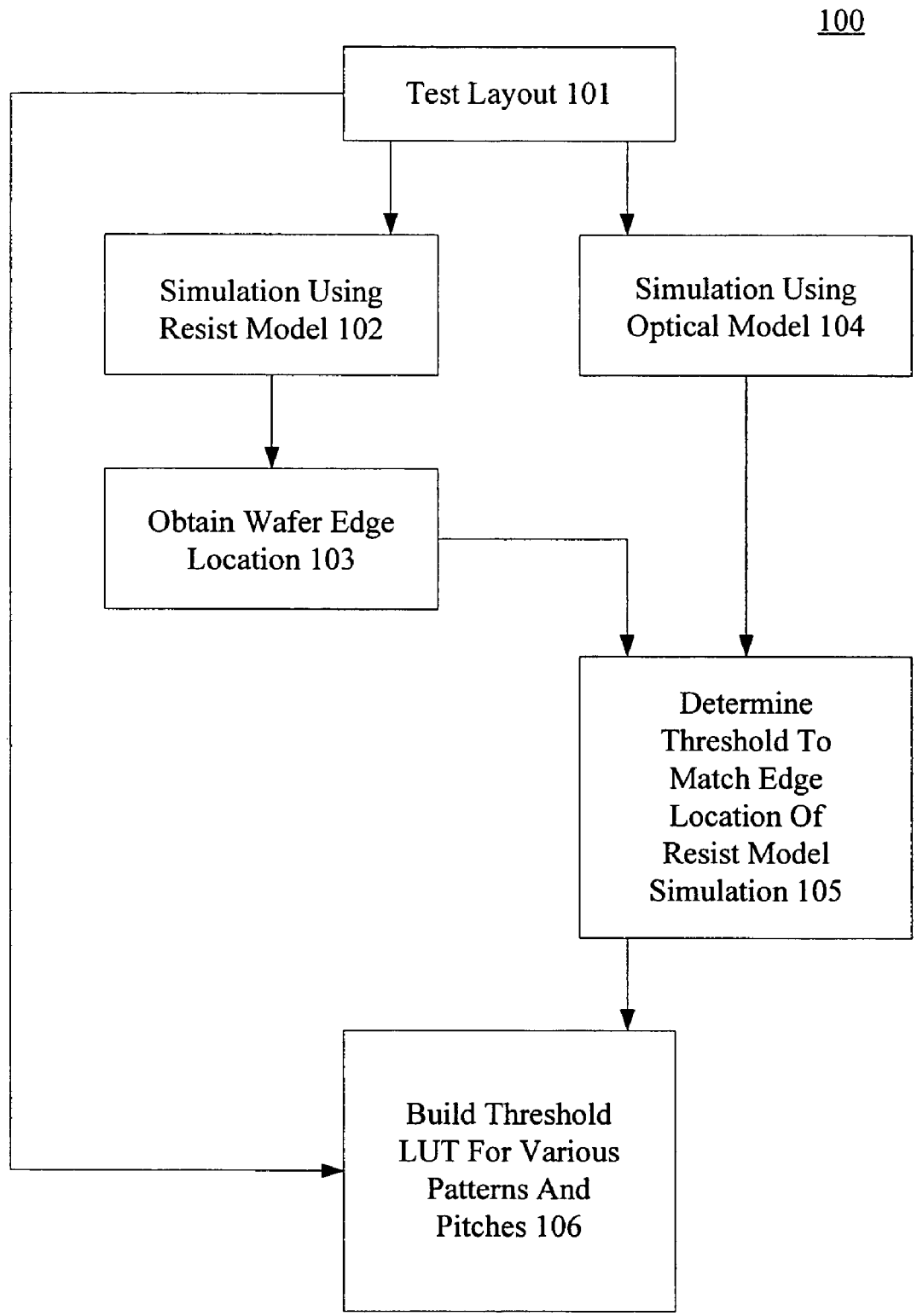
FIG. 1 illustrates an exemplary process for threshold calibration.

FIG. 1 illustrates an exemplary calibration process 100 for generating a threshold LUT. In step 101, a test layout including various patterns (e.g. lines and contacts), pitch sizes (which indicates isolated versus densely populated features), feature sizes, and defect/feature types can be received/generated. This test layout can then be simulated using a resist model in step 102. (Note that the simulation using the resist model also includes the optical model.) The simulation using the resist model can generate a simulated wafer image in step 103. This simulated wafer image provides an accurate wafer edge location because it includes detailed resist information.

A simulation can also be performed using the optical model in step 104 to generate an aerial image that indicates light intensity as a function of position. In step 105, based on the CD information provided by the simulated wafer edge locations for each feature, a threshold on the aerial image associated with that feature can be calculated. In other words, the CD information provided by the resist model simulation is matched to the aerial image information provided by the optical model simulation to accurately compute the threshold. Of importance, this threshold can vary for different patterns, pitch sizes, feature sizes, and defect types. The matched information for each feature (for example, threshold and at least one of pattern, pitch size, feature size, and defect type) on the test layout can be stored in a threshold LUT in step 106. The dimensions, and thus the complexity, of this LUT are dependent on the number of variables.

Note that step 102 is performed based on one particular resist. For example, for each fabrication facility, one or two resists could be currently available. If simulation results from other types of resist are desired, then step 102 can be performed for those resists as well. The results from these additional resist model simulations can also be incorporated into the threshold LUT in step 106.

Figure 2:
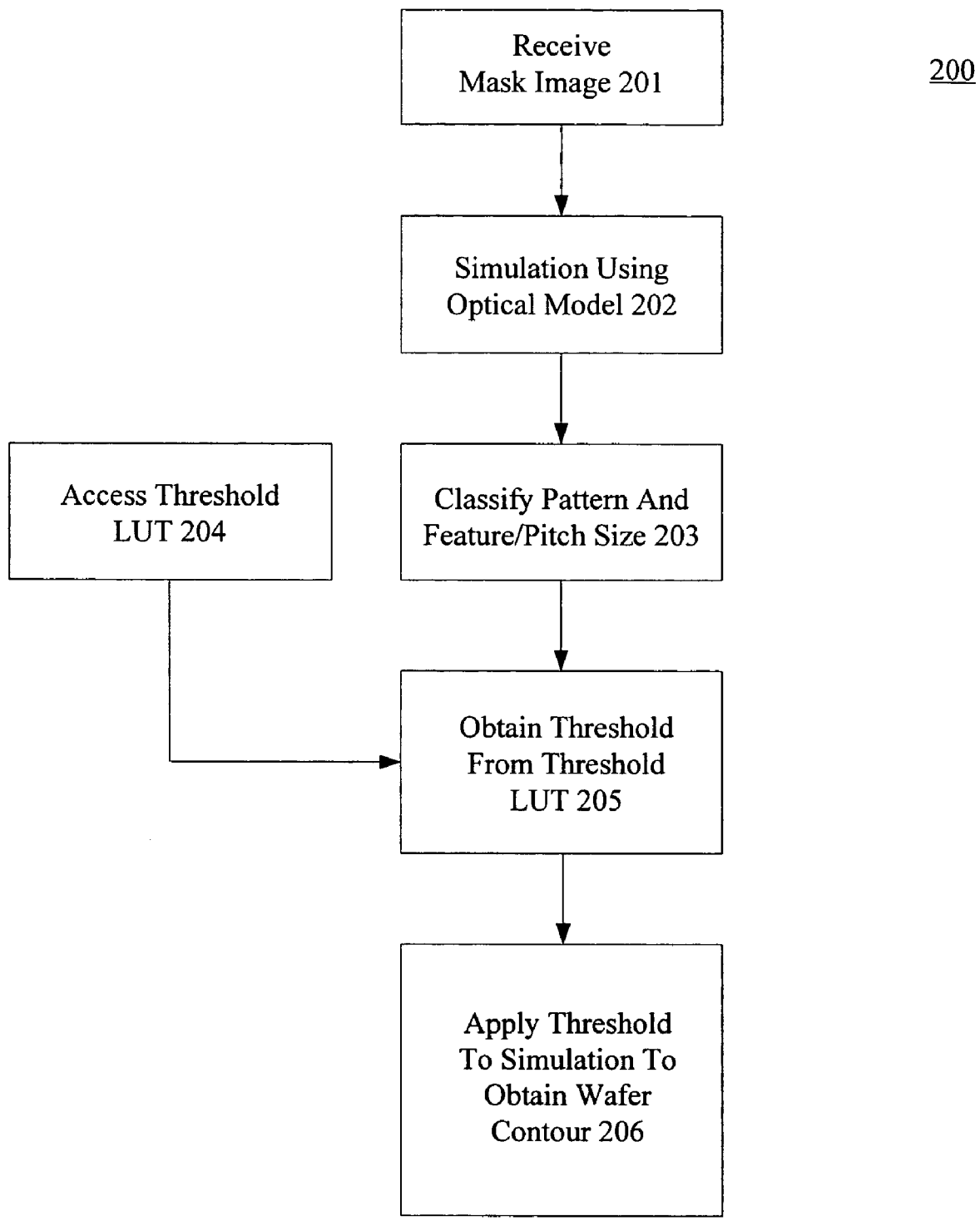
FIG. 2 illustrates a process for using this LUT in a design simulation.

Advantageously, the threshold LUT derived from the test layout can then be applied to any design. For example, FIG. 2 illustrates a process 200 for using this LUT in a design simulation. Specifically, in step 201, a mask image can be received using conventional inspection techniques. In step 202, a simulation can be performed on this mask image using the optical model. In step 203, the defect/feature of interest can be characterized, i.e. classified by pattern, feature size, pitch size, etc. In step 204, the threshold LUT can be accessed. At this point, once characterized and using the threshold LUT, the threshold for this defect/feature can be determined in step 205. Note that this characterization could result in an exact match or indicate the closest match in the LUT.

Figure 3A:
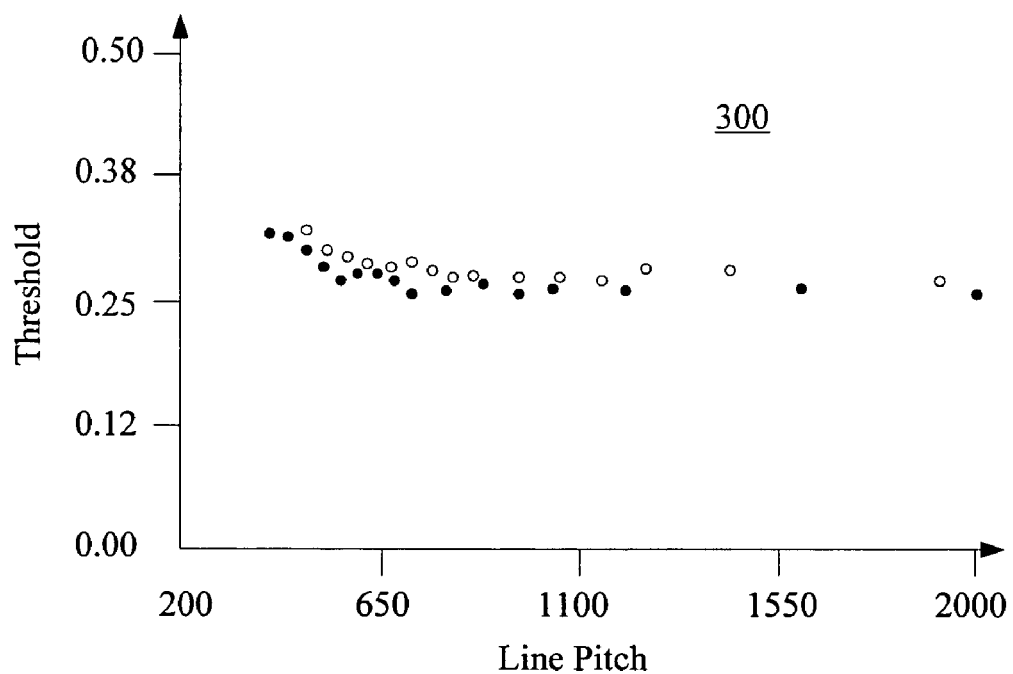
FIG. 3A illustrates a graph indicating that threshold varies as line pitch increases.

FIG. 3A illustrates a graph 300 plotting threshold versus line pitch (nm). Graph 300 could be generated (e.g. by step 105) by performing simulation on a test pattern of lines/spaces using a resist model and an optical model, then determining the threshold to match an edge location of the resist model. In graph 300, the circles with black fill indicate calibrated thresholds for lines having a 200 nm width whereas circles with white fill indicate calibrated thresholds for lines having a 240 nm width. Note that the calibrated threshold varies as line pitch increases. The calibrated threshold information of FIG. 3A can be stored in the threshold LUT.

Figure 3B:
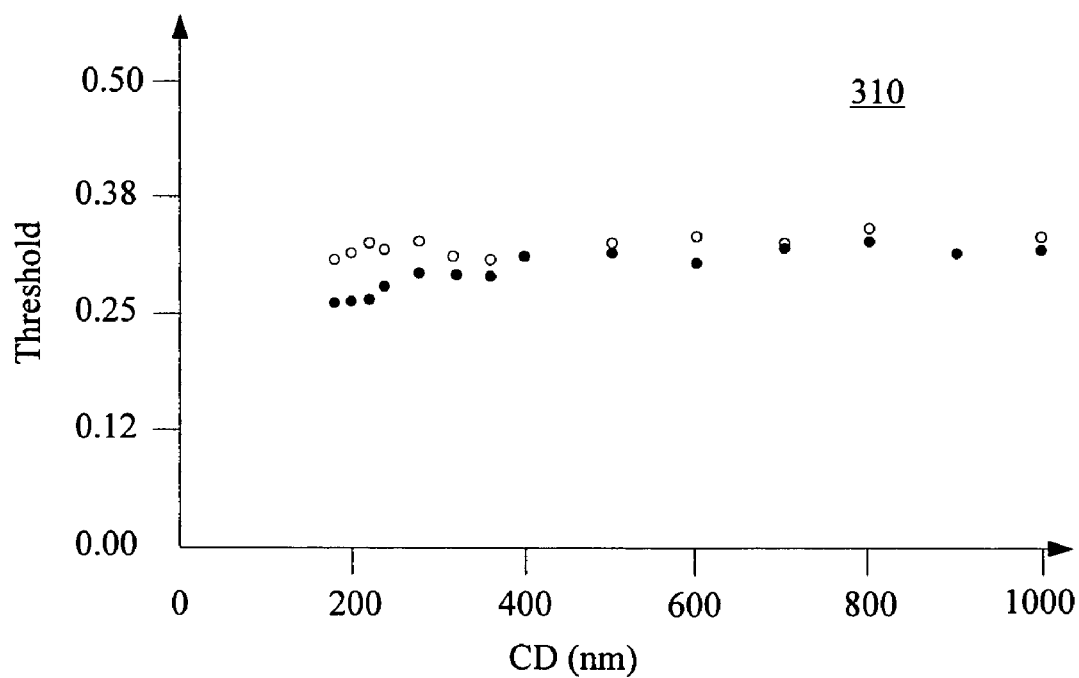
FIG. 3B illustrates a graph indicating that the threshold varies as the CD increases.

FIG. 3B illustrates a graph 310 plotting threshold versus critical dimension (CD)(nm). In graph 310, the circles with black fill indicate calibrated thresholds for isolated lines whereas circles with white fill indicate calibrated thresholds for densely spaced lines. The pitch size in each group of data is constant. Graph 310 indicates that the calibrated threshold varies as the CD increases. The calibrated threshold information of FIG. 3B can also be stored in the threshold LUT.

Advantageously, this threshold information can be used in step 206 (FIG. 2) to generate a simulated wafer image or other defect/feature analysis. Thus, by using the threshold LUT, the simulated wafer image and/or analysis can have the accuracy of a resist model simulation with the speed of an optical model simulation. Hence, this process could be called a hybrid model.

In some embodiments, the Virtual Stepper® tool set, licensed from the parent corporation of Numerical Technologies, Inc. (Synopsys, Inc.), can be suitably modified to support the steps of process 200. Specifically, this tool set can include a plurality of computer-implemented programs for implementing the steps described in reference to FIG. 2 (e.g. classifying pattern and feature/pitch size, accessing a threshold LUT, and applying the appropriate threshold to the simulation to obtain an accurate wafer contour). In some embodiments, the ProGen® tool set, licensed from Synopsys, Inc., can be used to generate the resist model of process 200. Specifically, this tool set can include a plurality of computer-implemented programs for implementing generating resist model that will be used in process 200. In some embodiments, the ICWorkbench® tool set, licensed from the parent corporation of Numerical Technologies, Inc. (Synopsys, Inc.), can be used to support the steps of process 200. Specifically, this tool set can include a plurality of computer-implemented-programs for implementing the some steps described in reference to FIG. 2 (e.g. simulation of test pattern using an optical model).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, the calibration process described in reference to FIG. 1 can include other simulation models, such as an etching model. Specifically, a mask house may decide to perform full model simulation including optical models, resist models, and etching models. Note that this full model simulation may be called resist modeling because below a predetermined feature size the resist modeling can be the predominant factor in determining a feature's edge location on the wafer. In any case, the purpose of the threshold LUT is to quickly provide a more accurate threshold than that provided by a simulation run with another less accurate model.

Note that the methods described herein can be applied to a variety of lithographic process technologies, including ultraviolet, deep ultraviolet (DUV), extreme ultraviolet (EUV), and x-ray. Accordingly, it is intended that the scope of the invention be defined by the following Claims and their equivalents.

The invention claimed is:

1. A method of automatically performing a wafer simulation, the method comprising:
   receiving a mask image;
   performing a wafer simulation of the mask image using an optical model;
   characterizing a feature from the mask image;
   obtaining threshold data from a look-up table (LUT) based on the characterizing, the LUT generated using a resist model and organized based on feature size, pitch size, and feature/defect identification; and
   applying the threshold data to the wafer simulation to generate accurate wafer contours of the feature.

2. The method of claim 1, wherein obtaining threshold data can indicate an exact match or a closest match in the LUT.

3. A method of automatically performing a wafer simulation, the method comprising:
   receiving a mask image;
   performing a wafer simulation of the mask image using a first model;
   characterizing a feature from the mask image;
   obtaining threshold data from a look-up table (LUT) based on the characterizing, the LUT generated using a second model more accurate than the first model and organized based on feature size, pitch size, and feature/defect identification; and
   applying the threshold data to the wafer simulation to generate wafer contours of the feature.

4. The method of claim 3, wherein obtaining threshold data can indicate an exact match or a closest match in the LUT.

5. A method of determining a wafer contour of a mask feature, the method comprising:
   simulating the wafer contour by applying an optical model to the mask feature;
   accessing resist information in a look-up table (LUT) to determine a threshold associated with the mask feature, the LUT organized based on feature size, pitch size, and feature/defect identification; and
   improving an accuracy of the water contour using the threshold.

6. The method of claim 5, wherein the LUT table includes optical information.

7. The method of claim 5, wherein the LUT table includes etch information.

8. A computer-implemented program for generating a wafer contour, the program comprising:
   code for receiving a mask image;
   code for performing a wafer simulation of the mask image using an optical model;
   code for characterizing a feature from the mask image;
   code for obtaining threshold data from a look-up table (LUT) based on the characterizing, the LUT generated using a resist model and organized based on feature size, pitch size, and feature/defect identification; and
   code for applying the threshold data to the wafer simulation to generate accurate wafer contours of the feature.

9. The program of claim 8, wherein code for obtaining threshold data can provide at least one of an exact match in the LUT and a closest match in the LUT.

10. A method of creating a look-up table (LUT) for use in a wafer simulation, the method including:
    receiving a test layout;
    simulating the test layout using a resist model, which provides accurate wafer edge locations of features on the test layout;
    simulating the test layout using an optical model, which provides aerial image information of the features on the test layout;
    matching the accurate wafer edge locations of the features to the aerial image information of the features;
    computing thresholds for a plurality of features based on the matching; and
    storing the thresholds in the LUT organized based on feature size, pitch size, and feature/defect identification.

11. The method of claim 10, wherein thresholds vary for different patterns, pitch sizes, feature sizes, and defect types.

12. The method of claim 10, wherein the LUT can include the thresholds for more than one resist.

13. The method of claim 10, wherein the aerial image information indicates light intensity as a function of position.

14. The method of claim 10, wherein the test layout includes various patterns, pitch sizes, and feature sizes.

* * * * *